US011802476B2

United States Patent
Herrera Baño et al.

(10) Patent No.: US 11,802,476 B2
(45) Date of Patent: Oct. 31, 2023

(54) VARIATION H COILS CALIBRATION METHOD FOR TRIAXIAL MAGNETOMETERS

(71) Applicants: Verónica Vanessa Herrera Baño, Celle (DE); Gunnar Tackmann, Hannover (DE); Thomas Kruspe, Wietzendorf (DE); Thomas Kunkiel, Hannover (DE)

(72) Inventors: Verónica Vanessa Herrera Baño, Celle (DE); Gunnar Tackmann, Hannover (DE); Thomas Kruspe, Wietzendorf (DE); Thomas Kunkiel, Hannover (DE)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 0 days.

(21) Appl. No.: 17/097,352

(22) Filed: Nov. 13, 2020

(65) Prior Publication Data

US 2021/0148220 A1    May 20, 2021

Related U.S. Application Data

(60) Provisional application No. 62/935,284, filed on Nov. 14, 2019.

(51) Int. Cl.
*E21B 47/09* (2012.01)
*E21B 47/092* (2012.01)
(Continued)

(52) U.S. Cl.
CPC ............ *E21B 47/092* (2020.05); *E21B 47/13* (2020.05); *G01R 33/0094* (2013.01); *G01V 3/26* (2013.01)

(58) Field of Classification Search
CPC .... E21B 47/092; E21B 47/13; G01R 33/0094
See application file for complete search history.

(56) References Cited

U.S. PATENT DOCUMENTS

| 3,800,213 A | 3/1974 | Rorden |
| 4,439,732 A | 3/1984 | Hesterman et al. |

(Continued)

FOREIGN PATENT DOCUMENTS

| CN | 1639542 A | 7/2005 |
| CN | 103089242 A | 5/2013 |

(Continued)

OTHER PUBLICATIONS

Estes, R., et al.; "Improvement of Azimuth Accuracy by Use of Iterative Total Field Calibration Technique and Compensation for System Environment Effects"; 12 Pages; 64th Annual Technical Conference and Exhibition of the Society of Petroleum Engineers held in San Antonio. TX. Oct. 8-11, 1989.

(Continued)

*Primary Examiner* — Alvaro E Fortich
(74) *Attorney, Agent, or Firm* — CANTOR COLBURN LLP (57) ABSTRACT

A directional tool and method of surveying a wellbore with the directional tool in a borehole string. A first sensor of the directional tool is disposed in a non-homogeneous ambient magnetic field. A first applied magnetic field is applied to the first sensor. A first measurement is obtained at the first sensor while the first sensor is disposed within the non-homogeneous ambient magnetic field and with the first applied magnetic field applied. A second applied magnetic field is applied to the first sensor. A second measurement is obtained at the first sensor while the first sensor is disposed within the non-homogeneous ambient magnetic field and with the second applied magnetic field applied. The directional tool is calibrated based on the first and second measurement. A (Continued)

downhole survey measurement is obtained with the calibrated directional tool in the wellbore.

28 Claims, 6 Drawing Sheets

(51) Int. Cl.
*G01R 33/00* (2006.01)
*G01V 3/26* (2006.01)
*E21B 47/13* (2012.01)

(56) References Cited

U.S. PATENT DOCUMENTS

| | | | |
|---|---|---|---|
| 4,623,842 A | 11/1986 | Bell et al. | |
| 4,929,899 A | 5/1990 | Weixelman et al. | |
| 4,933,640 A | 6/1990 | Kuckes | |
| 5,258,755 A | 11/1993 | Kuckes | |
| 5,694,037 A | 12/1997 | Palstra et al. | |
| 6,130,534 A | 10/2000 | Huang et al. | |
| 6,487,782 B1 | 12/2002 | Bond | |
| 7,295,943 B2 | 11/2007 | Cho et al. | |
| 7,352,177 B2 | 4/2008 | Lee et al. | |
| 8,669,763 B2 | 3/2014 | Takatsuji | |
| 9,250,100 B2 | 2/2016 | Wu et al. | |
| 9,273,547 B2 | 3/2016 | Brooks et al. | |
| 9,335,383 B2 | 5/2016 | Fukasawa et al. | |
| 9,459,098 B2 | 10/2016 | Grenet et al. | |
| 9,841,470 B2 | 12/2017 | Hwang et al. | |
| 9,863,785 B2 | 1/2018 | Wu et al. | |
| 11,290,708 B2* | 3/2022 | Haskin | H04N 17/002 |
| 2003/0085059 A1* | 5/2003 | Kuckes | E21B 47/024 |
| | | | 175/45 |
| 2003/0184305 A1* | 10/2003 | Niina | G01V 3/081 |
| | | | 324/252 |
| 2005/0056461 A1* | 3/2005 | Estes | E21B 47/022 |
| | | | 175/45 |
| 2008/0129281 A1 | 6/2008 | Lemp | |
| 2012/0239341 A1* | 9/2012 | Liu | G01R 33/1276 |
| | | | 702/130 |
| 2013/0314092 A1* | 11/2013 | Shumway | G01V 3/40 |
| | | | 324/346 |
| 2014/0081574 A1* | 3/2014 | Hove | G01V 11/00 |
| | | | 702/6 |
| 2015/0143889 A1* | 5/2015 | Kim | G01V 7/00 |
| | | | 702/6 |
| 2015/0268371 A1* | 9/2015 | Donderici | G01V 3/02 |
| | | | 324/346 |
| 2015/0308260 A1* | 10/2015 | Kuckes | E21B 43/305 |
| | | | 175/45 |
| 2015/0331138 A1* | 11/2015 | Estes | G01V 7/005 |
| | | | 324/346 |
| 2016/0041234 A1 | 2/2016 | Li et al. | |
| 2016/0299252 A1* | 10/2016 | Zacharko | E21B 7/04 |
| 2017/0167244 A1* | 6/2017 | Beckman | E21B 47/007 |

FOREIGN PATENT DOCUMENTS

| | | |
|---|---|---|
| CN | 105891755 A | 8/2016 |
| WO | 2015150627 A1 | 10/2015 |
| WO | 2017065731 A1 | 4/2017 |

OTHER PUBLICATIONS

International Search Report and Written Opinion for International Application No. PCT/US2020/060400; International Filing Date Nov. 13, 2020; dated Feb. 26, 2021; 7 Pages.
Kok, M., et al.; "Magnetometer calibration using inertial sensors"; IEEE Sensors Journal, vol. 16, Issue 14, pp. 5679-5689, Jul. 14, 2016.
Kunkiel, T.; "Development of a Digital Fluxgate-Magnetometer for use in Downhole Directional Drilling"; Master Thesis; FernUniversität in Hagen; Baker Hughes a GE company; Feb. 13, 2018; 120 Pages.
Lei, C., et al.; "Improved micro fluxgate sensor with double layer Fe-based amorphous core"; Microsystem Technologies; ResearchGate; Feb. 2012; 7 Pages; Received: Apr. 5, 2012 / Accepted: Apr. 27, 2012 / Published online: May 12, 2012.DOI: 10.1007/s00542-012-1523-z.
Petrucha, V., et al.; "Cross-Field Effect in a Triaxial AMR Magnetometer With Vector and Individual Compensation of a Measured Magnetic Field"; 5 Pages; IEEE Transactions on Magnetics, vol. 53, No. 4, Apr. 2017. DOI: 10.1109/TMAG.2016.2617121.
Ren, Y., et al.; "A Measuring System for Well Logging Attitude and a Method of Sensor Calibration"; Sensors 2014, 14, 9256-9270; 15 Pages; Received: Mar. 10, 2014; in revised form: May 12, 2014 / Accepted: May 21, 2014 /Published: May 23, 2014. doi:10.3390/s140509256.

* cited by examiner

VARIATION H COILS CALIBRATION METHOD FOR TRIAXIAL MAGNETOMETERS

CROSS REFERENCE TO RELATED APPLICATIONS

This application claims the benefit of an earlier filing date from U.S. Provisional Application Ser. No. 62/935,284 filed Nov. 14, 2019, the entire disclosure of which is incorporated herein by reference.

BACKGROUND

In the resource recovery industry, magnetic field sensors, such as fluxgate magnetometers, can be used in downhole applications such as surveying, drill string course correction, etc. The accuracy of these measurements are dependent upon the magnetometers being properly calibrated. Calibration procedures for the magnetometers are performed against natural or ambient magnetic fields. These fields may be inhomogeneous due to steel structure or magnetic components near the calibration location, which causes difficulties in the calibration process. Accordingly, there is a need to develop a method for calibrating magnetometers in regions of unknown and/or inhomogeneous ambient magnetic fields.

SUMMARY

Disclosed herein is a method of surveying a wellbore with a directional tool in a borehole string. A first sensor of the directional tool is disposed in a non-homogeneous ambient magnetic field. A first applied magnetic field is applied to the first sensor. A first measurement is obtained at the first sensor while the first sensor is disposed within the non-homogeneous ambient magnetic field and with the first applied magnetic field applied. A second applied magnetic field is applied to the first sensor. A second measurement is obtained at the first sensor while the first sensor is disposed within the non-homogeneous ambient magnetic field and with the second applied magnetic field applied. The directional tool is calibrated based on the first and second measurement. A downhole survey measurement is obtained with the calibrated directional tool in the wellbore.

Also disclosed herein is a system for a directional tool for use in a borehole string for surveying a wellbore. The directional tool includes a first sensor calibrated by: disposing the first sensor in a non-homogeneous ambient magnetic field, applying a first applied magnetic field to the first sensor, obtaining a first measurement at the first sensor, while the first sensor is disposed within the non-homogeneous ambient magnetic field and with the first applied magnetic field applied, applying a second applied magnetic field to the first sensor, obtaining a second measurement at the first sensor while the first sensor is disposed within the non-homogeneous ambient magnetic field and with the second applied magnetic field applied, and calibrating the directional tool based on the first measurement and the second measurement. A downhole survey measurement is obtained with the calibrated directional tool disposed in the wellbore.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

In the present invention, a directional tool or probe including a main (uncalibrated) sensor of a downhole tool is calibrated against a reference (calibrated) sensor. These sensors may be characterized by a scale parameter in a way that the sensor response can be calculated by the scale parameter and the applied field. A known angle, e.g. a measured angle, does exist between the directional tool or probe and the reference sensor. For example, the known angle between the directional tool or probe and the reference sensor may be 0°, such that an axis of the directional tool or probe and an axis of the reference sensor are aligned along a same directional tool or probe axis. The main sensor is misaligned with the axis of the directional tool or probe by a misalignment angle that is determined during the calibration process. An applied magnetic field is applied to both the main sensor and the reference sensor, in addition to an ambient magnetic field such as a natural or background magnetic field that may non-homogeneous. In the context of this disclosure, non-homogeneous magnetic fields include anisotropic magnetic fields, for example anisotropic magnetic fields that have a homogeneous total magnetic field strength. Non-homogenous magnetic fields may be time invariant at least for the time that is required to make the measurements for the calibration process as described below. Magnetic measurements with the applied magnetic field are used to determine the scale parameters and an optional bias of the main sensor that in turn may be used to determine the misalignment angle. Downhole magnetic field measurement at the main sensor can then be corrected based on the scale parameter, the optional bias, and the misalignment angle.

Figure 1:
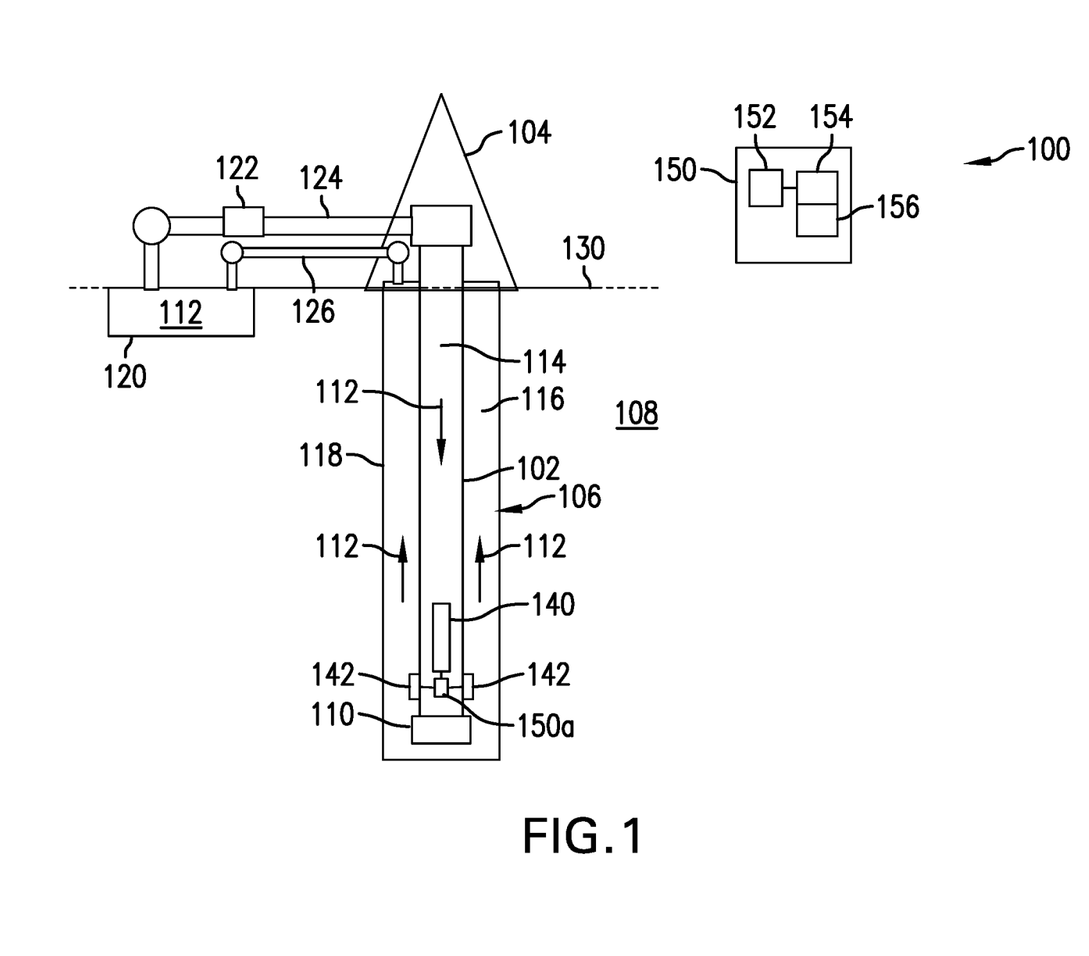
FIG. 1 shows an drilling assembly in an illustrative embodiment.

Referring to FIG. 1, a drilling assembly 100 is shown in an illustrative embodiment. The drilling assembly 100 includes a drill string 102 extended from a drilling rig 104 into a wellbore 106 formed in a formation 108. The drill string 102 includes a drill bit 110 at a bottom end for drilling the wellbore 106. The drill bit 110 can be rotated by rotation of the drill string 102 from the drilling rig 104 at a surface location 130 and/or by rotation of a downhole motor (not shown). The drill string 102 includes a hollow inner bore 114 and forms an annulus between an outer surface of the drill string 102 and a wall 118 of the wellbore 106.

In operation, a drilling mud 112 is pumped from a mud pit 120 at the surface location 130 downhole through the inner bore 114 via a pump 122 at the surface location 130 and exits the drill string 102 at the drill bit 110. The pump 122 is generally located in a standpipe 124 that transfers the drilling mud 112 from the mud pit 120 to a top of the drill string 102. Once the drilling mud 112 exits the drill string 102 at the drill bit 110, the drilling mud 112 returns to the surface location 130 via the annulus 116. At the surface location 130, the drilling mud 112 is returned to the mud pit 120 via a return line 126.

The drill string 112 further includes a control unit 150 for controlling various operations of the drill string 102. The control unit 150 includes a processor 152 and a memory storage device 154 that includes various programs and instructions 156 that, when accessed by the processor 152, enable the processor 152 to perform various operations disclosed herein. The control unit 150 can be located at a surface location 130 or at a downhole location along the drill string 102, such as downhole control unit 150a.

The drill string 112 further includes a steering unit 140 suitable for changing a drilling direction of the drill string 102. In various embodiments, the downhole control unit 150a activates the steering unit 140 based on survey information. The drill string 102 further includes a tool, such as a directional tool that may be a drilling tool or may be a probe 142 included in a drilling tool and may include survey instruments. The directional tool or probe 142 can include an inclinometer. In various embodiments, the directional tool or probe 142 includes a set of magnetometers that respond to and obtain measurements of the earth's magnetic field. The magnetometers can be single-axis or multiple-axis, such as dual-axial/bi-axial, or tri-axial magnetometers. In various embodiments, the magnetometers are fluxgate sensors, Hall effect magnetometer, magnetoresistive sensors, superconducting quantum interference devices (SQUID), MEMS, Lorentz force type magnetometers, atomic gas magnetometers, atom interferometers, fiberoptic magnetometers, or any other magnetometer device known in the art. The measurements of the magnetic field can be used at the downhole control unit 150a or the surface control unit 150 in order to determine a direction of drilling for the drill string 102 and to therefore activate the steering unit 140 in order to change the direction of the drill string 102 as to the direction of drilling determined by the measurements.

In an alternative embodiment, the directional tool or probe 142 is included in a wireline string (not shown) configured to be lowered into the wellbore 106 to make downhole survey measurements while the directional tool or probe 142 is downhole in wellbore 106. Prior to use in the borehole string, such as the wireline string or the drill string 102, the magnetometers of the directional tool or probe 142 may be calibrated in order to provide accurate downhole measurements. A method for calibrating magnetometers of the directional tool or probe 142 are discussed below.

In one embodiment, the directional tool or probe 142 includes a combination of one bi-axial sensor and one single axial sensor. In various embodiments, the directional tool or probe 142 includes two two-axis magnetometers, one of which is used consistently as a two-axis magnetometer, and the other of which is used either as two-axis or single-axis magnetometer, depending on the requirement of the directional tool or probe. In additional embodiments, a directional tool or probe 142 can include one or two three-axis magnetometers. Two magnetometers aligned along a selected direction and similarly oriented can be used to determine a magnetic field gradient along the alignment direction.

In one embodiment, the magnetometers calibrated with the method described here can be assumed to have a response $H_m$ to a magnetic field H that can then be defined by a first-degree polynomial, which can then be written as shown in Eq. (1):

$$H_m \alpha H + \beta \qquad \text{Eq. (1)}$$

where $\alpha$ (also referred to as the "alpha matrix") includes one or more scale parameters and misalignment coefficients of the sensors and $\vec{\beta}$ (also referred to as the "beta vector") includes one or more bias coefficients of the magnetometers. However, magnetometer responses that can be defined by a first-degree polynomial are merely an example and are not to be understood as a limitation. While the method is illustrated herein using responses that can be defined by a first-degree polynomial, it is understood that the method can be easily applied and expanded to magnetometer responses that are defined, interpolated, or described by higher-degree polynomials or other functions, such as exponential functions, logarithmic functions, step functions, such as tables, or any combination thereof. Higher-degree polynomials or other functions that are used to define, interpolate or describe magnetometer responses may include more than one scale parameter per magnetic field component. For example, higher-degree polynomials or other functions that are used to define, interpolate or describe magnetometer responses may include two, five, ten, or more scale parameters per magnetic field component.

Figure 2:
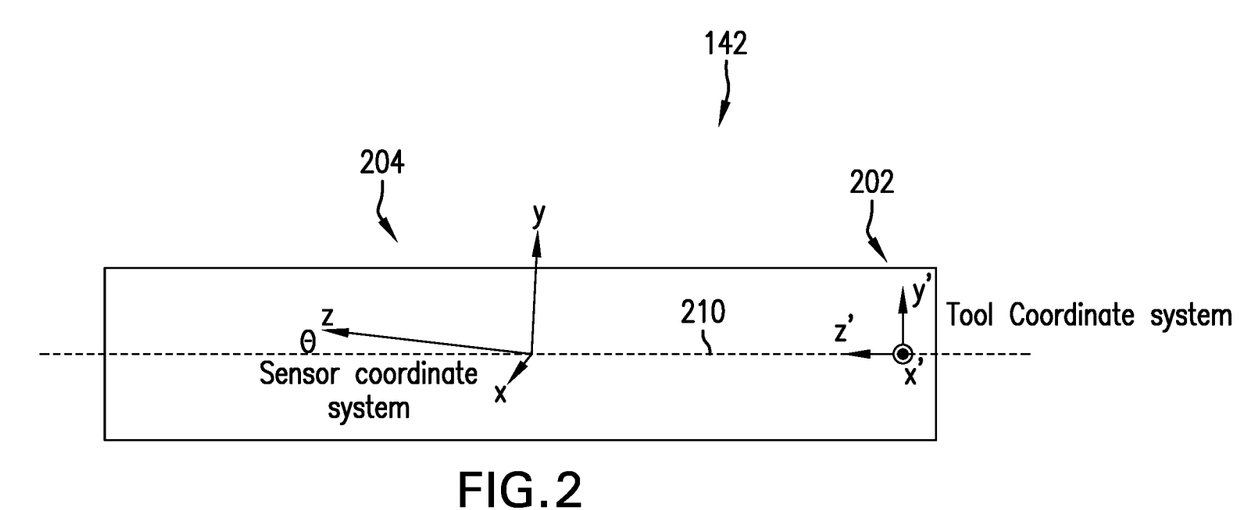
FIG. 2 illustrates a directional tool or probe showing a directional tool or probe coordinate system and a sensor coordinate system of a sensor installed within the directional tool or probe.

FIG. 2 illustrates a directional tool or probe 142 showing a directional tool or probe coordinate system 202 and a sensor coordinate system 204 of a magnetometer installed within the directional tool or probe 142. The directional tool or probe coordinate system 202 is indicated by using primed vectors (x', y', z'). The z'-axis is parallel to a longitudinal axis 210 of the directional tool or probe 142, and the x'-axis and y'-axis are directed within in a plane transverse (typically perpendicular) to the longitudinal axis 210. In the example of FIG. 2, the x'-axes is directed perpendicularly to z' and out of the page while the y'-axis is perpendicular to the z' (longitudinal axis 210) and x' and lies within the page.

The sensor coordinate system 204 is indicated by using unprimed vectors (x, y, z). The sensor coordinate system 204 is shown as being misaligned with the directional tool or probe coordinate system 202 in order to reflect the problem of misalignment being addressed by the present invention. When mounting the sensors in the mechanical assembly of the directional tool or probe 142, small axis misalignments make it difficult to align an axis of the sensors with the directional tool or probe axis. This misalignment between a selected directional tool or probe axis and a selected sensor axis is represented by $\theta_{tool\ axes'-sensor\ axes}$ (i.e., the angle between both axes). Thus, the projection of magnetic field components in the axes of the directional tool or probe into the axes of the sensor is expressed as a so-called misalignment coefficient which is the cosine of this misalignment angle (i.e., cos ($\theta_{tool\ axes'-sensor\ axes}$)). This cosine term is part of an alpha component (i.e., $\alpha_{tool\ axes'-sensor\ axes}$) of the alpha matrix of Eq. (1) that represents scale and misalignment errors. In particular, coefficient $\alpha_{tool\ axes'-sensor\ axes}$ of the alpha matrix is can be written as shown in Eq. (2): $\alpha_{tool\ axes-sensor\ axes}$ of the alpha matrix is can be written as shown in Eq. (2):

$$\alpha_{tool\ axes'-sensor\ axes} = \alpha_0 \cos(\theta_{tool\ axes'-sensor\ axes}) \qquad \text{Eq. (2)}$$

where $\alpha_0$ is a scale coefficient based on a sensitivity of the sensor and interference from the environment and $\theta_{tool\ axes-sensor\ axes}$ is the misalignment angle between axes of the sensor and of the directional tool or probe.

The response $\vec{H}_m$ of a tri-axial arrangement of magnetometers can be represented as shown in Eq. (3):

$$\vec{H}_m = \alpha \cdot \vec{H}' + \vec{\beta} \qquad \text{Eq. (3)}$$

where $\vec{H}'$ is a magnetic field within the (x', y', z') coordinate system of the directional tool or probe. Eq. (3) is valid for one-axial or multi-axial arrangements of magnetometers, such as bi-axial, tri-axial or even higher-axial arrangements of magnetometers. The number of vector components of $\vec{H}_m$, $\vec{H}'$, and $\vec{\beta}$ equals the number of axes of the multi-axial arrangement of magnetometers while the number of matrix elements of matrix $\alpha$ equals the square of the number of axes of the multi-axial arrangement of magnetometers. For example, for a one-axial arrangement of magnetometers, the number of vector components of $\vec{H}_m$, $\vec{H}'$, and $\vec{\beta}$ equals one while the number of matrix elements of matrix $\alpha$ equals also one. In other words, for a one-axial arrangement, $\vec{H}_m$, $\vec{H}'$, and $\vec{\beta}$ and $\alpha$ are simple scalars. For a bi-axial arrangement of magnetometers, the number of vector components of $\vec{H}_m$, $\vec{H}'$, and $\vec{\beta}$ equals two while the number of matrix elements of matrix $\alpha$ equals four. For a tri-axial arrangement of magnetometers, the number of vector components of $\vec{H}_m$, $\vec{H}'$, and $\vec{\beta}$ equals three while the number of matrix elements of matrix $\alpha$ equals nine. Merely for the sake of illustration and not meant to be a limitation, the following derivation is made for tri-axial arrangement of magnetometers. The discussion below can be easily conveyed to other one-axial or multi-axial arrangements of magnetometers. For a tri-axial arrangement of magnetometers, Eq. (3) can be rewritten in expanded form as shown in Eq. (4):

$$\begin{bmatrix} H_{m_x} \\ H_{m_y} \\ H_{m_z} \end{bmatrix} = \begin{bmatrix} \alpha_{x'-x} & \alpha_{y'-x} & \alpha_{z'-x} \\ \alpha_{x'-y} & \alpha_{y'-y} & \alpha_{z'-y} \\ \alpha_{x'-z} & \alpha_{y'-z} & \alpha_{z'-z} \end{bmatrix} \cdot \begin{bmatrix} H_{x'} \\ H_{y'} \\ H_{z'} \end{bmatrix} + \begin{bmatrix} \beta_x \\ \beta_y \\ \beta_z \end{bmatrix} \qquad \text{Eq. (4)}$$

where $H_{m_x}$ is the response of the sensor in the sensor's x-axis, $H_{m_y}$ is the response of the sensor in the sensor's y-axis, and $H_{m_z}$ is the response of the sensor in the sensor's z-axis. Coefficients $\beta_x$, $\beta_y$, and $\beta_z$ are bias coefficients along the sensor's respective x-, y-, and z-axes.

Using Eq. (2), the alpha $\alpha$ matrix from Eq. (4) can be decomposed into its scale coefficients and a function of the misalignment angles as:

$$\alpha = \begin{bmatrix} \alpha_{0_x} & 0 & 0 \\ 0 & \alpha_{0_y} & 0 \\ 0 & 0 & \alpha_{0_z} \end{bmatrix} \cdot \begin{bmatrix} \cos(\theta_{x'-x}) & \cos(\theta_{y'-x}) & \cos(\theta_{z'-x}) \\ \cos(\theta_{x'-y}) & \cos(\theta_{y'-y}) & \cos(\theta_{z'-y}) \\ \cos(\theta_{x'-z}) & \cos(\theta_{y'-z}) & \cos(\theta_{z'-z}) \end{bmatrix} \qquad \text{Eq. (5)}$$

Which can also be written as in Eq. (6):

$$\alpha = \begin{bmatrix} \alpha_{0_x}\cos(\theta_{x'-x}) & \alpha_{0_x}\cos(\theta_{y'-x}) & \alpha_{0_x}\cos(\theta_{z'-x}) \\ \alpha_{0_y}\cos(\theta_{x'-y}) & \alpha_{0_y}\cos(\theta_{y'-y}) & \alpha_{0_y}\cos(\theta_{z'-y}) \\ \alpha_{0_z}\cos(\theta_{x'-z}) & \alpha_{0_z}\cos(\theta_{y'-z}) & \alpha_{0_z}\cos(\theta_{z'-z}) \end{bmatrix} \qquad \text{Eq. (6)}$$

As an illustrative example, $\alpha_{0_y}$ a scale coefficient along the y axis and $\theta_{y'-x}$ is the angle between directional tool or probe axis y' with respect to the sensor axis x. The coefficient $\alpha_{y'-x}$ from Eq. (4) is accountable for the projections of the field in the direction of the y' axis of the directional tool or probe with respect to the x axes of the sensor. Therefore, for example, the coefficient of the alpha matrix between the directional tool or probe y'-axis and the sensor z-axis can be written as a product of the scale coefficient along the sensor z-axis and the angle between the directional tool or probe y'-axis and the sensor z-axis, as shown in Eq. (7):

$$\alpha_{y'-z} = \alpha_{0_z} \cdot \cos(\theta_{y'-z}) \qquad \text{Eq. (7)}$$

Due to misalignments between the directional tool or probe sensor, the measurement along a selected axis of the sensor such as the z axis (i.e., $H_{m_z}$) carries information from all the three components of the magnetic field referenced along the directional tool or probe axes (i.e., $H_{x'}$, $H_{y'}$, and $H_{z'}$). Eqns. (8), (9) and (10), which represent calculations along the bottom row of Eq. (4), describes the decomposition of the sensor magnetic field component of the sensor with respect to the magnetic fields in the directional tool or probe axes for the example of $H_{m_z}$:

$$[H_{m_z}] = \begin{bmatrix} \alpha_{x'-z} & \alpha_{y'-z} & \alpha_{z'-z} \end{bmatrix} \cdot \begin{bmatrix} H_{x'} \\ H_{y'} \\ H_{z'} \end{bmatrix} + [\beta_z] \qquad \text{Eq. (8)}$$

$$H_{m_z} = \alpha_{x'-z} H_{x'} + \alpha_{y'-z} H_{y'} + \alpha_{z'-z} H_{z'} + \beta_z \qquad \text{Eq. (9)}$$

and $$H_{m_z} = \qquad \text{Eq. (10)}$$
$$\alpha_{0_z} \cos(\theta_{x'-z}) H_{x'} + \alpha_{0_z} \cos(\theta_{y'-z}) H_{y'} + \alpha_{0_z} \cos(\theta_{z'-z}) H_{z'} + \beta_z$$

Typically, the angle of misalignment ($\theta_{x'-z}$) between directional tool's or probe's z'-axis and sensor's z-axis is a small angle (e.g., less than ±10 degrees, such as less than ±5 degrees, for example less than ±2 degrees). Therefore for $H_{m_z}$, the contributions of the magnetic field components perpendicular to the longitudinal axis 210 (i.e., components $H_{x'}$, and $H_{y'}$) are significantly smaller than the contribution of the magnetic field component parallel to the longitudinal axis (i.e., component $H_{z'}$).

For example, when the angle between the z-axis and the z'-axis is small (e.g., less than ±10 degrees, such as less than ±5 degrees, for example less than ±2 degrees), the angles $\theta_{x'-z}$ and $\theta_{y'-z}$ of Eq. (10) approach 90 degrees. In this case, the approximations of Eq. (11) and Eq. (12) below hold:

$$\cos(\theta_{x'-z}) \ll \cos(\theta_{z'-z}) \qquad \text{Eq. (11)}$$

$$\cos(\theta_{y'-z}) \ll \cos(\theta_{z'-z}) \qquad \text{Eq. (12)}$$

Therefore, Eq. (13) and Eq. (14) are true:

$$\alpha_{x'-z} \ll \alpha_{z'-z} \qquad \text{Eq. (13)}$$

$$\alpha_{y'-z} \ll \alpha_{z'-z} \qquad \text{eq. (14)}$$

Figure 3:
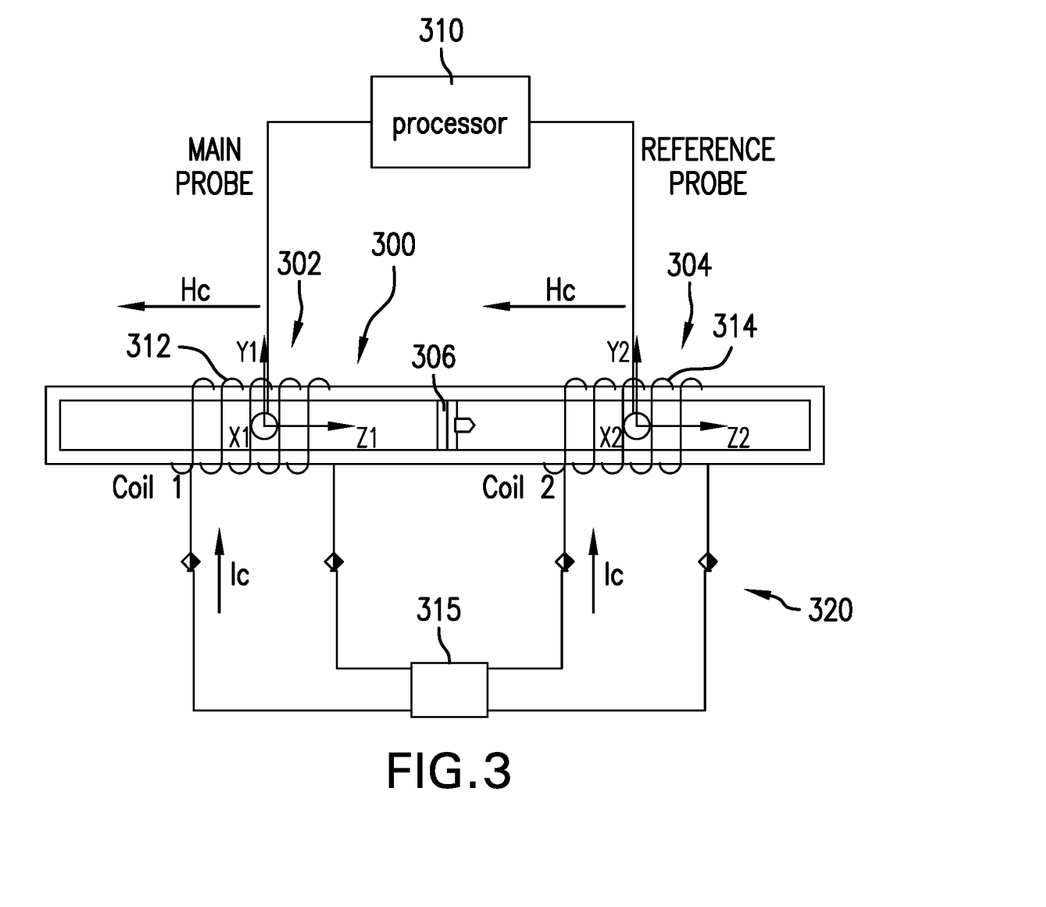
FIG. 3 shows an illustrative magnetic measurement directional tool or probe that can be used for surveying and geo-steering of a drill string, together with a reference directional tool or probe and a calibration assembly.

FIG. 3 shows an illustrative first directional tool or probe 300 that can be used for surveying and geo-steering of a drill string, such as drill string 102. The first directional tool or probe 300 is mounted within a calibration assembly 320. The first directional tool or probe 300 includes a first sensor 302 (also referred to herein as a "main sensor") that is to be calibrated. A second sensor 304 (also referred to herein as a "reference sensor") is included in the calibration assembly 320. The first sensor 302 is axially separated from the second sensor 304 by a selected separation distance. For a tri-axial arrangement of magnetometers, the first sensor 302 and second sensor 304 are tri-axial sensors characterized by a x1-, y1-, z1-coordinate system and a x2-, y2-, z2-coordinate system, respectively. An unknown misalignment angle may exist between the longitudinal axis z' of the first directional tool or probe and the x1-, y1-, z1-coordinate system of the first sensor in a way that none of the x1-, y1-, z1-axes of the first sensor is directed into the direction of the longitudinal axis z' of the first directional tool or probe. In addition, the longitudinal axis z' of the first directional tool or probe 300 and the x2-, y2-, z2-coordinate system of the reference sensor may be separated by a separation angle in a way that at least one of the x1-, y2-, and z2-axis and the z' axis are separated by the separation angle that can be measured and/or selected. For example, the longitudinal axis z' of the first directional tool or probe 300 and the z2 axis of the reference sensor may be separated by a separation angle of 0°, such as the z2-axes of the reference sensor is directed or substantially directed along the longitudinal axis z' of the first directional tool or probe 300 or the longitudinal axis z' of the first directional tool or probe 300 and the z2 axis of the reference sensor may be separated by a separation angle of 20 degree, 30 degree, 45 degree, or any other suitable separation angle. In one embodiment, the second sensor 304 is included in a second directional tool or probe. Advantageously, the first directional tool or probe 300 and the second directional tool or probe are of the same or similar kind, e.g. of the same or similar dimensions, materials, and/or designs. Such a configuration of a first and second directional tool or probe of same or similar kind would ensure that magnetic disturbances caused by the first directional tool or probe would be the same as or similar to magnetic disturbances caused by the second directional tool or probe. In one embodiment, the second directional tool or probe is already calibrated and the separation angle described above is defined by the angle between the longitudinal axis of the first directional tool or probe and the second directional tool or probe. In addition, an optional barrier 306 can be provided between the first sensor 302 and second sensor 304 to isolate the first sensor 302 from the second sensor 304. Due to their axial separation and due to the potentially non-homogeneous ambient magnetic field, the first sensor 302 and second sensor 304 generally experience different magnetic fields.

In one embodiment, the first directional tool or probe 300 and the second directional tool or probe may include other directional sensors, such as accelerometers/gravitometers (not shown), or gyroscopes. Such other directional sensors may be utilized to at least partially align the first directional tool or probe 300 and the second directional tool or probe to adjust or measure a separation angle between the first directional tool or probe 300 and the second directional tool or probe, such as the separation angle between the first directional or probe 300 and the second directional tool or probe is below 10 degrees, such as below 5 degrees or even below 2 degrees. For example, the first directional tool or probe 300 and the second directional tool or probe may be at least partially aligned to each other by using at least one of the high side of the first directional tool or probe 300 or the high side of the second directional tool or probe as a reference point. This can be performed by aligning one axis of accelerometers/gravitometers or gyroscope (not shown) that may respectively be aligned with the reference sensor and the main sensor in the directional tool or probe 300 opposite to the gravity field for both sensors. However, once put in position, there is generally still an angular misalignment between the z1-axis of the first sensor 302 and the longitudinal axis of the first directional tool or probe. Similarly, there can be an angular misalignment between the z2-axis of the second sensor 304 and the longitudinal axis of the second directional tool or probe.

FIG. 3 further shows a pair of coils for introducing an applied magnetic field to the first and second sensors. Alternatively, one or more permanent could be utilized to apply the applied magnetic field to the first and second sensor. The pair of coils can be electrically coupled to a power supply 315 that provides a current through the coils in order to create one or more magnetic fields at the first and second sensors. Additionally, measurements from the pair of coils can be sent to processor 310, which performs the various calculations disclosed herein for calibrating the main sensor within the first directional tool or probe, determining misalignment angles, scale parameters, sensor biases, etc. A main coil 312 can be used to apply an applied magnetic field to the first sensor 302 and a reference coil 314 can be used to apply an applied magnetic field to the second sensor 304. In various operations, the main coil 312 and the reference coil 314 apply the same applied magnetic field to the first sensor 302 and the second sensor 304, respectively. The applied magnetic field may be controlled, e.g. by means of a control algorithm. In various embodiments, the main coil 312 and the reference coil 314 can be a single coil that extends along the length of the first and/or second directional tool or probe 300 to cover both the first sensor 302 and the second sensor 304. The main coil 312 and reference coil 314 are shown oriented to produce the applied magnetic fields along the longitudinal axis z' of the first or first and second directional tool or probe. In additional embodiments discussed below, the main coil 312 and reference coil 314 can be oriented to produce magnetic fields along the first directional tool's or probe's x'-axis and y'-axis.

To calibrate the main sensor 302 to the reference sensor 304, a first set of magnetic measurements is obtained with a first applied magnetic field is applied and then a second set of magnetic measurements is obtained once a second applied magnetic field is applied. In one embodiment, the first applied magnetic field or the second applied magnetic field may be zero. For example, if the first applied magnetic field is zero, a first set of magnetic measurements is obtained without the applied magnetic field being applied and then a second set of magnetic measurements is obtained once the second non-zero applied magnetic field is applied. Eqs. (3) and (4) generally describe the relation between the measurements of the magnetic field in the directional tool or probe coordinate system and the magnetic field in the coordinate system of each sensor. Therefore, application of these equations provides enough information to determine scale parameters, misalignment angles and bias coefficients as will be shown below. Advantageously, such measurements can be done at different temperatures, e.g. by using heating and/or cooling equipment, such as a heating and/or cooling chamber. Determination of the calibration parameters, such as scale parameters, misalignment angles, and bias coefficients, at various temperatures will allow to determine and apply calibration parameters as a function of temperature. For example, if a first set of calibration parameters is determined at a first temperature, it can be applied to measurements that are made at a temperature that is represented by the first temperature, e.g. measurements that fall within the same temperature bin as the first temperature. If a second set of calibration parameters is determined at a second temperature, it can be applied to measurements that are made at a temperature that is represented by the second temperature, e.g. measurements that fall within the same temperature bin as the second temperature, etc. Such temperature-dependent calibration allows for much more accurate measurements if the calibration parameters depend significantly on the temperature. Similarly, in some directional tools or probes, there are wires installed that may carry a significant current disturbing the local magnetic field at the position of the sensor when in operation. If not considered, such current carrying wires could lead to a systematic measurement error if not considered by the calibration method. Consequently, one or more wires (not shown) or other conductors may be added to the calibration assembly 320 that are suited to carry a selected current and thus may be used to simulate a disturbing magnetic field caused by a current passing by the first sensor 302 when in operation. For example, one or more wires may be added within the directional tool or probe that is at the same or similar position and carries the same or similar current as if in operation downhole. Determination of the calibration parameters, such as scale parameters, misalignment angles, and bias coefficients, at various currents in the one or more wires or conductors will allow to determine and apply calibration parameters as a function of current and/or distance between wire or conductor and sensor. For example, if a first set of calibration parameters is determined at a first current/distance leading to a first disturbing magnetic field, it can be applied to measurements that are made at a disturbing magnetic field that is represented by the first disturbing magnetic field, e.g. measurements that fall within the same disturbing magnetic field bin as the first disturbing magnetic field. If a second set of calibration parameters is determined at a second current/distance leading to a second disturbing magnetic field, it can be applied to measurements that are made at a disturbing magnetic field that is represented by the second disturbing magnetic field, e.g. measurements that fall within the same disturbing magnetic field bin as the second disturbing magnetic field, etc. Such disturbing magnetic field dependent calibration allows for much more accurate measurements if the calibration parameters depend significantly on disturbing magnetic fields that may occur when in operation.

In the following, it is assumed that a first set of magnetic measurements is obtained without the applied magnetic field being applied and then a set of magnetic measurements is obtained once the non-zero applied magnetic field is applied. As outlined above, this is a special case of when a first set of magnetic measurements is obtained with a first applied magnetic field is applied and then a second set of magnetic measurements is obtained once a second applied magnetic field is applied. In the case when a first set of magnetic measurements is obtained without the applied magnetic field being applied and then a set of magnetic measurements is obtained once the non-zero applied magnetic field is applied, inverting Eq. (3) yields the following Eq. (15):

$$\vec{H}' = \alpha^{-1} \cdot (\vec{H}_m - \vec{\beta})$$ Eq. (15)

Similarly, inverting Eq. (4) yields the following Eq. (16):

$$\begin{bmatrix} H_{x'} \\ H_{y'} \\ H_{z'} \end{bmatrix} = \begin{bmatrix} \alpha_{x'-x} & \alpha_{y'-x} & \alpha_{z'-x} \\ \alpha_{x'-y} & \alpha_{y'-y} & \alpha_{z'-y} \\ \alpha_{x'-z} & \alpha_{y'-z} & \alpha_{z'-z} \end{bmatrix}^{-1} \cdot \left( \begin{bmatrix} H_{m_x} \\ H_{m_y} \\ H_{m_z} \end{bmatrix} - \begin{bmatrix} \beta_x \\ \beta_y \\ \beta_z \end{bmatrix} \right)$$ Eq. (16)

The following calibration method is used in order to determine the components of the $\alpha$ matrix and of the $\vec{\beta}$ vector. At a first time ($t=t_0$), a measurement is made of the ambient magnetic field at both the main sensor 302 and the reference sensor 304. Due to inhomogeneity of the ambient magnetic field, the ambient magnetic field at the main sensor 302 and reference sensor 304 may be different. In general, the main sensor 302 will measure ambient magnetic field $\vec{H}_1$ while reference sensor 304 measures ambient magnetic field $\vec{H}_2$ where $\vec{H}_1 \neq \vec{H}_2$. At a second time ($t=t_1$), a known applied magnetic field $H_c$ is applied via the coils 312, 314 and a second set of measurements are made at the main sensor 302 and the reference sensor 304.

At the first time ($t=t_0$) only the ambient magnetic field is measured. At the first sensor 302, raw measurements $M1_x$, $M1_y$, and $M1_z$ are defined as shown in Eq. (17):

$$\begin{bmatrix} M1_x \\ M1_y \\ M1_z \end{bmatrix} = \begin{bmatrix} H_{m_x} \\ H_{m_y} \\ H_{m_z} \end{bmatrix} = \begin{bmatrix} \alpha_{x'-x} & \alpha_{y'-x} & \alpha_{z'-x} \\ \alpha_{x'-y} & \alpha_{y'-y} & \alpha_{z'-y} \\ \alpha_{x'-z} & \alpha_{y'-z} & \alpha_{z'-z} \end{bmatrix} \cdot \begin{bmatrix} H1_{x'} \\ H1_{y'} \\ H1_{z'} \end{bmatrix} + \begin{bmatrix} \beta_x \\ \beta_y \\ \beta_z \end{bmatrix}$$ Eq. (17)

where $H1_{x'}$, $H1_{y'}$, and $H1_{z'}$ are the x', y' and z' components of the true magnetic field at the location of the first sensor 302.

Since the second sensor 304 is previously calibrated, the measurements $M2_x$, $M2_y$, and $M2_z$ are equal to $H2_{x'}$, $H2_{y'}$, and $H2_{z'}$, i.e., the x', y' and z' component of the true magnetic field at the location of the second sensor 304 as shown in Eq. (18):

$$\begin{bmatrix} M2_x \\ M2_y \\ M2_z \end{bmatrix} = \begin{bmatrix} H2_{x'} \\ H2_{y'} \\ H2_{z'} \end{bmatrix}$$ Eq. (18)

At a second time period ($t=t_1$), a current Ic is applied to the coil or coils 312, 314 to generate the applied magnetic field $\vec{H}_c$ at each of the sensors 302, 304. Current Ic may be controlled to generate a controlled applied magnetic field. The applied magnetic field $\vec{H}_c =$ $$\begin{bmatrix} H_{c_{x'}} \\ H_{c_{y'}} \\ H_{c_{z'}} \end{bmatrix}$$

may be aligned with an axis of the first directional tool or probe, such as the z'-axis of the first directional tool or probe. Therefore, $H_{c_{x'}} = H_{c_{y'}} = 0$ applies. When the applied magnetic field $\vec{H}_c$ is applied to the first sensor, the output values are as shown in Eq. (19):

$$\begin{bmatrix} M1_x \\ M1_y \\ M1_z \end{bmatrix} = \begin{bmatrix} H_{m_x} \\ H_{m_y} \\ H_{m_z} \end{bmatrix} =$$

$$\begin{bmatrix} \alpha_{x'-x} & \alpha_{y'-x} & \alpha_{z'-x} \\ \alpha_{x'-y} & \alpha_{y'-y} & \alpha_{z'-y} \\ \alpha_{x'-z} & \alpha_{y'-z} & \alpha_{z'-z} \end{bmatrix} \cdot \begin{bmatrix} H1_{x'} + H_{c_{x'}} \\ H1_{y'} + H_{c_{y'}} \\ H1_{z'} + H_{c_{z'}} \end{bmatrix} + \begin{bmatrix} \beta_x \\ \beta_y \\ \beta_z \end{bmatrix}$$ Eq. (19)

When the applied magnetic field $\vec{H}_c$ is applied to the second sensor 304, the output values are as shown in Eq. (20):

$$\begin{bmatrix} M2_x \\ M2_y \\ M2_z \end{bmatrix} = \begin{bmatrix} H2_{x'} + H_{c_{x'}} \\ H2_{y'} + H_{c_{y'}} \\ H2_{z'} + H_{c_{z'}} \end{bmatrix} \quad \text{Eq. (20)}$$

Scale parameter $\alpha_{z'\text{-}z}$ along the z-axis can be determined using the calculations discussed below with respect to Eqs. (21)-(24). First the scale parameters are determined using measurements from the reference sensor. From Eq. (17):

$$M1_z(t_0) = \alpha_{x'\text{-}z}H1_x + \alpha_{y'\text{-}z}H1_y + \beta_{z'\text{-}z}H1_z + \beta_z \quad \text{Eq. (21)}$$

From Eq. (19) with $H_{c_{x'}} = H_{c_{y'}} = 0$, it can be concluded:

$$M1_z(t_1) = \alpha_{x'\text{-}z}H1_x + \alpha_{y'\text{-}z}H1_y + \alpha_{z'\text{-}z}(H1_z + H_{c_{z1}}) + \beta_z \quad \text{Eq. (22)}$$

Combining Eq. (21) and Eq. (22) results in:

$$M1_z(t_1) = M1_z(t_0) + \alpha_{z'\text{-}z}H_{c_{z'}} \quad \text{Eq. (23)}$$

and therefore $$\alpha_{z'-z} = \frac{M1_z(t_1) - M1_z(t_0)}{H_{c_{z'}}} \quad \text{Eq. (24)}$$

Measurements from the reference sensor at time $t=t_0$ (Eq. (18)) produce the following Eqs. (25)-(27):

$$M2_x(t_0) = H2_{x'} \quad \text{Eq. (25)}$$

$$M2_y(t_0) = H2_{y'} \quad \text{Eq. (26)}$$

$$M2_z(t_0) = H2_{z'} \quad \text{Eq. (27)}$$

Similarly, measurements from the reference sensor at time $t=t_1$ (Eq. (20)) produces the following Eq. (28):

$$M2_z(t_1) = H2_{z'} + H_{c_{z'}} \quad \text{Eq. (28)}$$

Combining Eq. (25) and (28) yields:

$$M2_z(t_1) = M2_z(t_0) + H_{c_{z'}} \quad \text{Eq. (29)}$$

Therefore:

$$H_{c_{z'}} = M2_z(t_1) - M2_z(t_0). \quad \text{Eq. (30)}$$

Eq. (30) determines the z'-component of the applied magnetic field, which can then be used in Eq. (24) to determine a value for $\alpha_{z'\text{-}z}$. As an alternative, $H_{c_{z'}}$ may be determined also by measuring the applied current to coils 312, 314 and the coil geometry. This can be done by analytic formula known in the art or numeric simulation of the magnetic field at the position of the first sensor.

The coils 312, 314 can now be reoriented to generate an applied magnetic field along the y'-axis and a new set of measurements is recorded at time $t=t_2$. At time $t=t_2$, an applied magnetic field $$\vec{H}_c = \begin{bmatrix} H_{c_{x'}} \\ H_{c_{y'}} \\ H_{c_{z'}} \end{bmatrix}$$

is applied to the main sensor 302 and reference sensor 304 in the direction of the y'-axis, so that $H_{c_{x'}} = H_{c_{z'}} = 0$. From the third row of the matrices of Eq. (19), it can be determined that:

$$M1_z(t_2) = \alpha_{x'\text{-}z}H1_x + \alpha_{y'\text{-}z}(H1_y + H_{c_{y'}}) + \alpha_{z'\text{-}z}H1_z + \beta_z. \quad \text{Eq. (32)}$$

Therefore, combining Eq. (17) and Eq. (32) produces:

$$M1_z(t_2) = M1_z(t_0) + \alpha_{y'\text{-}z}H_{c_{y'}} \quad \text{Eq. (33)}$$

and therefore $$\alpha_{y'-z} = \frac{M1_z(t_2) - M1_z(t_0)}{H_{c_{y'}}} \quad \text{Eq. (34)}$$

The value of $\alpha_{y'\text{-}z}$ can be calculated from Eq. (34), since all other variables are known. Specifically from Eq. (20), it is known that:

$$M2_y(t_2) = H2_{y'} + H_{c_{y'}} \quad \text{Eq. (35)}$$

Substituting Eq. (26) into Eq. (35) produces:

$$M2_y(t_1) = M2_y(t_0) + H_{c_{y'}} \quad \text{Eq. (36)}$$

which yields $$H_{c_{y'}} = M2_y(t_2) - M2_y(t_0) \quad \text{Eq. (37)}$$

Eq. (37) can be substituted into Eq. (34) to determine $\alpha_{y'\text{-}z}$.

The coils 312, 314 can now be reoriented to generate an applied magnetic field along the x'-axis and a new set of measurements are taken at time $t=t_3$. At time $t=t_3$, an applied magnetic field $$\vec{H}_c = \begin{bmatrix} H_{c_{x'}} \\ H_{c_{y'}} \\ H_{c_{z'}} \end{bmatrix}$$

is applied to the main sensor 302 and reference sensor 304 in the direction of the x'-axis, so that $H_{c_{y'}} = H_{c_{z'}} = 0$. From Eq. (19) it can be determined that:

$$M1_z(t_3) = \alpha_{x'\text{-}z}(H1_x + H_{c_{x'}}) + \alpha_{y'\text{-}z}H1_y + \alpha_{z'\text{-}z}H1_z + \beta_z \quad \text{Eq. (38)}$$

Combining Eq. (17) and Eq. (38) produces:

$$M1_z(t_3) = M1_z(t_0) + \alpha_{x'\text{-}z}H_{c_{x'}} \quad \text{Eq. (39)}$$

Therefore, $$\alpha_{x'-z} = \frac{M1_z(t_3) - M1_z(t_0)}{H_{c_{x'}}} \quad \text{Eq. (40)}$$

The value of $\alpha_{x'\text{-}z}$ can be calculated in Eq. (40), since all other variables are known. Specifically from Eq. (20) it is known that:

$$M2_x(t_3) = H2_x + H_{c_{x'}} \quad \text{Eq. (41)}$$

Substituting Eq. (27) into Eq. (41) produces:

$$M2_x(t_3) = M2_{z'z}(t_0) + H_{c_{x'}} \quad \text{Eq. (42)}$$

Therefore, $$H_{c_{x'}} = M2_x(t_3) - M2_x(t_0) \quad \text{Eq. (43)}$$

Eq. (43) can be substituted into Eq. (40) to determine $\alpha_{x'\text{-}z}$.

The steps shown in Eqs. (15) to (43) can be used to similarly derive all missing coefficients of matrix α as defined in Eq. 4. While the foregoing description of a calibration was limited to sensors with a response that can be defined, interpolated or described by one-degree polynomials (sometimes also known as "linear sensors"), the same method can be easily applied to sensors where higher-degree polynomials or other functions are used to define, interpolate or describe magnetometer responses and which may comprise more than one scale parameters per magnetic field component. In this case, the number of measurement that are to be taken at various applied magnetic fields has to be increased accordingly to come to a corresponding set of equations that can be solved either analytically or numerically (e.g. by numeric inversion, look-up functions, or similar).

In order to determine the bias coefficient along the z-axis, the magnetic fields along the y'-axis and x'-axis are made to be zero or substantially zero. In order to obtain neglectable magnetic fields along the y'-axis and x'-axis, the directional tool or probe is oriented with the z'-axis along parallel to the earth's magnetic field. For illustrative purposes, this is performed at time $t=t_4$. From Eq. (17), it can be concluded for time $t=t_4$:

$$\alpha_{y'\_z}H1_y \approx 0 \qquad \text{Eq. (44)}$$

$$\alpha_{y'\_z}H1_y \approx 0 \qquad \text{Eq. (45)}$$

$$M1_z(t_4) \approx \alpha_{z'\_z}H1_z + \beta_z \qquad \text{Eq. (46)}$$

At time $t=t_5$, the z'-axis of the first directional tool or probe is aligned to the earth's magnetic field and is rotated 180 degrees from its position at time $t=t_4$. The resulting magnetic fields at time $t=t_5$ are as follows:

$$\alpha_{y'\_z}H1_y \approx 0 \qquad \text{Eq. (47)}$$

$$\alpha_{y'\_z}H1_x \approx 0 \qquad \text{Eq. (48)}$$

$$M1_z(t_5) \approx \alpha - \alpha_{z'\_z}H1_z + \beta_z \qquad \text{Eq. (49)}$$

Adding Eq. (46) and Eq. (49) leads to:

$$M1_z(t_4) + M1_z(t_5) \approx 2\beta_z \qquad \text{Eq. (50)}$$

Therefore:

$$\beta_z \approx \frac{M1_z(t_4) + M1_z(t_5)}{2} \qquad \text{Eq. (51)}$$

In various embodiments, the calibration assembly 320 is rotated together with the first directional tool or probe 300 between $t=t_4$ and $t=t_5$. However, this may lead to disadvantages if the calibration assembly 320 contains magnetic materials. Advantageously, the calibration assembly 320 does not contain magnetic materials. In addition or alternatively, the calibration assembly 320 may not be rotated with the first directional tool or probe between $t=t_4$ and $t=t_5$. In aspects, it is also beneficial when the first directional tool or probe is rotated around the location of the first sensor 302. To achieve rotation of the first directional tool or probe around the location of the first sensor 302, the first directional tool or probe may be rotatably mounted in a way that the pivot axis for the rotation goes through the center of the first sensor 302 or passes the first sensor close to the center of the first sensor, e.g. at a distance not more than 50 cm, for example less than 20 cm, such as less than 10 cm.

Figure 4:
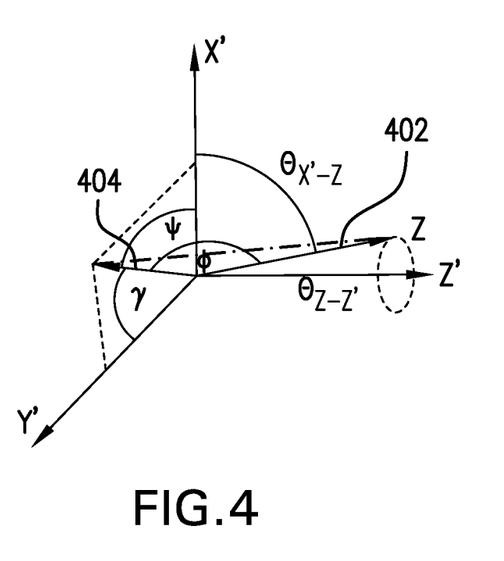
FIG. 4 shows a relation between the z-axes of a sensor and the axes of the directional tool or probe coordinate system.

FIG. 4 shows a relation between the z-axes of a sensor and the x'-, y'-, z'-axes of the directional tool or probe coordinate system. Since the x', y' and z' axes of the directional tool or probe as well as the x, y, and z axes of the sensor are orthogonal to each other, it is possible to express the misalignments with only two unknown angles, such as Φ and Ψ or γ and $\theta_{z'\_z}$, as shown in FIG. 4 and described below.

The components of the magnetic field in the sensor coordinate system can be written using the magnetic components in the directional tool or probe coordinate system using Eqs. (7)-(9) disclosed herein. The misalignment angle $\theta_{z'\_z}$ can be rewritten in terms of complementary angles. For example, misalignment angle $\theta_{z'\_z}$ can be written in terms of the angle Φ between z-axis 402 of the sensor and the projection 404 of the sensor's z-axis to the x'-y'-plane, where:

$$\theta_{z'\_z} + \Phi = 90° \Rightarrow \Phi = 90° - \theta_{z'\_z} \qquad \text{Eq. (52)}$$

Also from FIG. 4:

$$\gamma + \Psi = 90° \Rightarrow \Psi = 90° - \gamma \qquad \text{Eq. (53)}$$

Also from FIG. 4, it can be determined for the angle $\theta_{x'\_z}$ that:

$$\cos(\theta_{x'\_z}) = \cos(\Psi)*\cos(\Psi) \qquad \text{Eq. (54)}$$

and by combining this with Eq. (52) and Eq. (53), this leads to $$\cos(\theta_{x'\_z}) = \cos(90° - \gamma)*\cos(90° - \theta_{z'\_z}). \qquad \text{Eq. (55)}$$

Using trigonometric identities, Eq. (55) can be rewritten as:

$$\cos(\theta_{x'\_z}) = (\cos(90°)*\cos(\gamma) + \sin(90°)*\sin(\gamma))*(\cos(90°)*\cos(\theta_{z'\_z}) + \sin(90°)*\sin(\theta_{z'\_z})) \qquad \text{Eq. (56)}$$

thereby obtaining:

$$\cos(\theta_{x'\_z}) = \sin(\gamma)*\sin(\theta_{z'\_z}). \qquad \text{Eq. (57)}$$

With respect to angle $\theta_{x'\_z}$, it can be determined from FIG. 4 that:

$$\cos(\theta_{y'\_z}) = \cos(\gamma)*\cos(\Phi) \qquad \text{Eq. (58)}$$

Therefore, with Eq. (52), $$\cos(\theta_{y'\_z}) = \cos(\gamma)*\cos(90° - \theta_{z'\_z}). \qquad \text{Eq. (59)}$$

and with trigonometric identities $$\cos(\theta_{y'\_z}) = \cos(\gamma)*\sin(\theta_{z'\_z}). \qquad \text{Eq. (60)}$$

Using the results of Eqs. (57) and (60), Eq. (10) can be rewritten as:

$$H_{m_z} = \alpha_{0_z}\sin(\gamma)\sin(\theta_{z'\_z})H_x + \alpha_{0_z}\cos(\gamma)\sin(\theta_{z'\_z})H_y + \alpha_{0_z}\cos(\theta_{z'\_z})H_z + \beta_z \qquad \text{Eq. (61)}$$

Therefore, $$\alpha_{x'\_z} = \alpha_{0_z}\sin(\gamma)\sin(\theta_{z'\_z}) \qquad \text{Eq. (62)}$$

$$\alpha_{y'\_z} = \alpha_{0_z}\cos(\gamma)\sin(\theta_{z'\_z}) \qquad \text{Eq. (63)}$$

$$\alpha_{z'\_z} = \alpha_{0_z}\cos(\theta_{z'\_z}) \qquad \text{Eq. (64)}$$

By solving Eqs. (62)-(64) for the three parameters $\alpha_{0_z}$, γ, and $\theta_{z'\_z}$, the misalignment angle and the scale coefficient along the sensor z-axis can be determined. A corresponding analysis can be made to determine the scale coefficients along the sensor y-axis and the sensor x-axis as well other misalignment angles.

Figure 5:
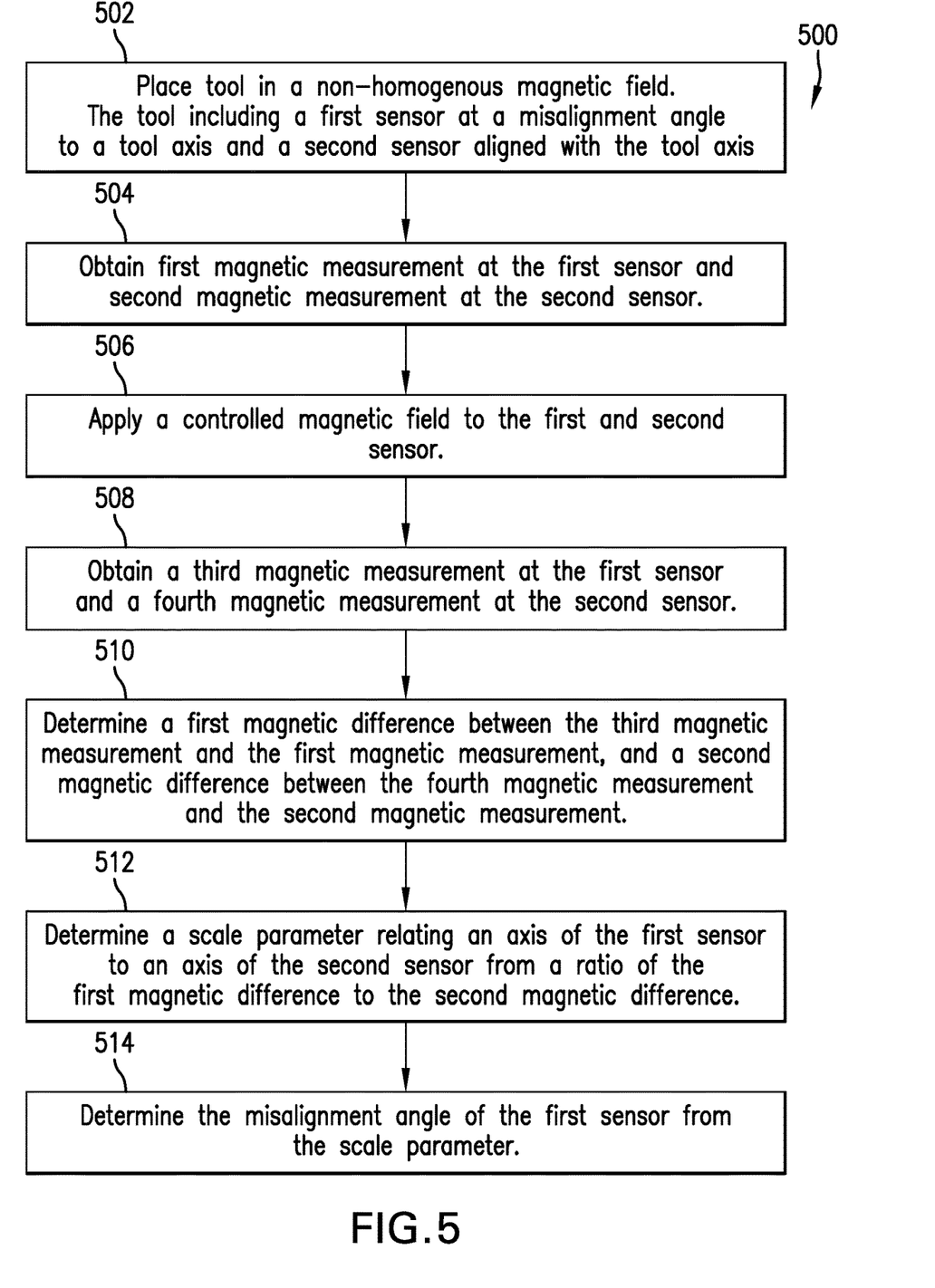
FIG. 5 shows a flowchart illustrating a method of determining a misalignment angle of a sensor.

FIG. 5 shows a flowchart 500 illustrating a method of determining a misalignment angle of a sensor, in an embodiment. In box 502, a first directional tool or probe is disposed in a non-homogeneous magnetic field, such as the earth's magnetic field, for example the ambient earth's magnetic field that is disturbed by magnetic material and/or sources. The first directional tool or probe includes a first sensor at a misalignment angle to an axis of the first directional tool or probe. A second sensor is disposed in the non-homogeneous magnetic field that may have a different strength at the position of the second sensor compared to the magnetic field strength of the non-homogeneous magnetic field at the position of the first sensor. The second sensor may be disposed within a second directional tool or probe which may have been calibrated before. In box 504, a first magnetic measurement is obtained at the first sensor and a second magnetic measurement is obtained at the second sensor. In box 506, an applied magnetic field is applied to the first sensor and the second sensor. In box 508, a third magnetic measurement is obtained at the first sensor and a fourth magnetic measurement is obtained at the second sensor while the applied magnetic field is applied. In box 510, a first magnetic difference is determined between the third magnetic measurement and the first magnetic measurement, and a second magnetic difference is determined between the fourth magnetic measurement and the second magnetic measurement. In box 512, a scale parameter relating an axis of the first sensor to an axis of the second sensor is determined from a ratio of the first magnetic difference to the second magnetic difference. In box 514, the misalignment angle of the first sensor is determined from the scale parameter.

Figure 6:
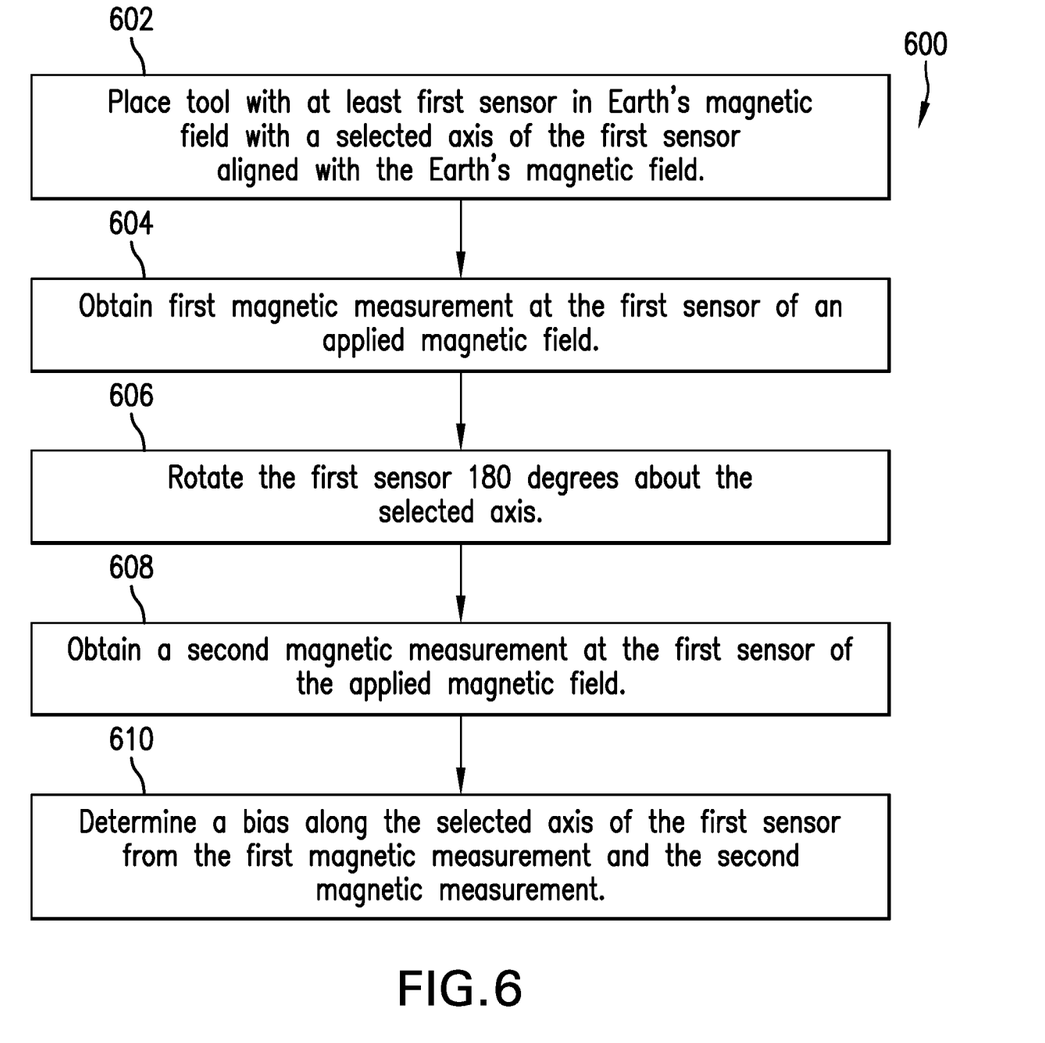
FIG. 6 shows a flowchart illustrating a method of determining a sensor bias.

FIG. 6 shows a flowchart 600 illustrating a method of determining a sensor bias. In box 602, the directional tool or probe, including at least the first sensor, is disposed in a non-homogeneous magnetic field (i.e., the Earths' magnetic field) with a selected axis (e.g., the z-axis) of the first sensor or the directional tool or probe aligned with the Earth' magnetic field. In box 604, a first magnetic measurement is obtained at the first sensor. In box 606, the first sensor is rotated 180 degrees about a rotation axis substantively perpendicular to the selected axis. Preferably, the rotation axis goes through the first sensor or at a close distance from the sensor (e.g. at a distance not more than 50 cm, for example less than 20 cm, such as less than 10 cm). In box 608, a second magnetic measurement is obtained at the first sensor. In box 610, the bias of the first sensor along the selected axis is determined from the first magnetic measurement and the second magnetic measurement.

Set forth below are some embodiments of the foregoing disclosure:

Embodiment 1: A method of surveying a wellbore with a directional tool in a borehole string. A first sensor of the directional tool is disposed in a non-homogeneous ambient magnetic field. A first applied magnetic field is applied to the first sensor. A first measurement is obtained at the first sensor while the first sensor is disposed within the non-homogeneous ambient magnetic field and with the first applied magnetic field applied. A second applied magnetic field is applied to the first sensor. A second measurement is obtained at the first sensor while the first sensor is disposed within the non-homogeneous ambient magnetic field and with the second applied magnetic field applied. The directional tool is calibrated based on the first and second measurement. A downhole survey measurement is obtained with the calibrated directional tool in the wellbore.

Embodiment 2: The method of any prior embodiment, wherein at least one of the first and second applied magnetic field is substantially zero.

Embodiment 3: The method of any prior embodiment, wherein the borehole string is a drill string and further comprising drilling the wellbore with the drill string by using the downhole survey measurements.

Embodiment 4: The method of any prior embodiment, further comprising disposing a second sensor in the non-homogeneous ambient magnetic field, applying the first applied magnetic field to the second sensor, obtaining a third measurement at the second sensor, while the second is disposed within the non-homogeneous ambient magnetic field and with the first applied magnetic field applied, applying the second applied magnetic field to the second sensor, obtaining a fourth measurement at the second sensor while the second sensor is disposed within the non-homogeneous ambient magnetic field and with the second applied magnetic field applied, and calibrating the directional tool based on the first, second, third, and fourth measurement.

Embodiment 5: The method of any prior embodiment, wherein the second sensor is a calibrated sensor.

Embodiment 6: The method of any prior embodiment, wherein calibrating includes determining one or more calibration parameters, the one or more calibration parameters being a function at least one of a sensitivity of the first sensor and a misalignment of the first sensor with respect to the directional tool.

Embodiment 7: The method of any prior embodiment, wherein the directional tool has a first longitudinal axis, further comprising determining a sensor reference angle between the first longitudinal axis and an axis of the second sensor and calibrating the directional tool based on the determined tool reference angle.

Embodiment 8: The method of any prior embodiment, wherein the directional tool has a first longitudinal axis and the second sensor is in a calibrated reference directional tool having a second longitudinal axis, further comprising determining a tool reference angle between the first longitudinal axis and the second longitudinal axis and calibrating the directional tool based on the determined tool reference angle.

Embodiment 9: The method of any prior embodiment, wherein the tool reference angle is smaller than 10 degrees.

Embodiment 10: The method of any prior embodiment, wherein the directional tool and the reference directional tool are of the same design with respect to at least one of dimensions, magnetic sources, and magnetic material distribution.

Embodiment 11: The method of any prior embodiment, wherein the directional tool has a first longitudinal axis and the first and the second applied magnetic field are substantially aligned to the first longitudinal axis.

Embodiment 12: The method of any prior embodiment, wherein the first sensor has a response to the first or second applied magnetic field that is defined by a first-degree polynomial.

Embodiment 13: The method of any prior embodiment, further comprising applying the applied magnetic field along at least one of the x-axis of the directional tool, the y-axis of the directional tool and the z-axis of the directional tool Embodiment 14: The method of any prior embodiment, wherein the directional tool has a first longitudinal axis, further comprising: determining a bias of the first sensor from a measurement of the first sensor obtained with the first longitudinal axis aligned parallel to the earth's magnetic field and a measurement of the first sensor obtained with the first longitudinal axis aligned anti-parallel to the earth's magnetic field.

Embodiment 15: The method of any prior embodiment, further comprising determining the misalignment of the first sensor with respect to the directional tool from the one or more calibration parameters.

Embodiment 16: The method of any prior embodiment, further comprising using the calibrated first sensor to determine a magnetic gradient in the wellbore.

Embodiment 17: The method of any prior embodiment, wherein calibrating includes determining one or more calibration parameters, the one or more calibration parameters being a function of temperature and wherein the calibration parameters are determined for a first temperature and a second temperature.

Embodiment 18: The method of any prior embodiment, wherein the directional tool includes a wire configured to carry a current and wherein calibrating includes determining one or more calibration parameters, wherein the calibration parameters being a function of the current and wherein the calibration parameters are determined for a first current through the wire and for a second current through the wire.

Embodiment 19: A directional tool for use in a borehole string for surveying a wellbore. The system includes a first sensor calibrated by: disposing the first sensor in a non-homogeneous ambient magnetic field, applying a first applied magnetic field to the first sensor, obtaining a first measurement at the first sensor, while the first sensor is disposed within the non-homogeneous ambient magnetic field and with the first applied magnetic field applied, applying a second applied magnetic field to the first sensor, obtaining a second measurement at the first sensor while the first sensor is disposed within the non-homogeneous ambient magnetic field and with the second applied magnetic field applied, and calibrating the directional tool based on the first measurement and the second measurement. A downhole survey measurement is obtained with the calibrated directional tool disposed in the wellbore.

Embodiment 20: The directional tool of any prior embodiment, wherein at least one of the first applied magnetic field and the second applied magnetic field is substantially zero.

Embodiment 21: The directional tool of any prior embodiment, wherein the borehole string is a drill string and further comprising drilling the wellbore with the drill string by using the downhole survey measurements.

Embodiment 22: The directional tool of any prior embodiment, further comprising disposing a second sensor in the non-homogeneous ambient magnetic field, applying the first applied magnetic field to the second sensor, obtaining a third measurement at the second sensor, while the second is disposed within the non-homogeneous ambient magnetic field and with the first applied magnetic field applied, applying the second applied magnetic field to the second sensor, obtaining a fourth measurement at the second sensor while the second sensor is disposed within the non-homogeneous ambient magnetic field and with the second applied magnetic field applied, and calibrating the directional tool based on the first, second, third, and fourth measurement.

Embodiment 23: The directional tool of any prior embodiment, wherein the second sensor is a calibrated sensor.

Embodiment 24: The directional tool of any prior embodiment, wherein calibrating includes determining one or more calibration parameters, the one or more calibration parameters being a function at least one of a sensitivity of the first sensor and a misalignment of the first sensor with respect to the directional tool.

Embodiment 25: The directional tool of any prior embodiment, wherein the directional tool has a first longitudinal axis, further comprising determining a sensor reference angle between the first longitudinal axis and an axis of the second sensor and calibrating the directional tool based on the determined tool reference angle.

Embodiment 26: The directional tool of any prior embodiment, wherein the directional tool has a first longitudinal axis and the second sensor is in a calibrated reference directional tool having a second longitudinal axis, further comprising determining a tool reference angle between the first longitudinal axis and the second longitudinal axis and calibrating the directional tool based on the determined tool reference angle.

Embodiment 27: The directional tool of any prior embodiment, wherein the tool reference angle is smaller than 10 degrees.

The use of the terms "a" and "an" and "the" and similar referents in the context of describing the invention (especially in the context of the following claims) are to be construed to cover both the singular and the plural, unless otherwise indicated herein or clearly contradicted by context. Further, it should be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The teachings of the present disclosure may be used in a variety of well operations. These operations may involve using one or more treatment agents to treat a formation, the fluids resident in a formation, a wellbore, and/or equipment in the wellbore, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited.

What is claimed is:

1. A method of surveying a wellbore with a directional tool, comprising:

disposing a first sensor of the directional tool in a non-homogeneous ambient magnetic field prior to use of the directional tool in a borehole string, wherein the non-homogeneous ambient magnetic field comprises an ambient earth's magnetic field that is disturbed by a magnetic material or a magnetic source;
applying a first applied magnetic field to the first sensor;
obtaining a first measurement at the first sensor while the first sensor is disposed within the non-homogeneous ambient magnetic field and with the first applied magnetic field applied;
applying a second applied magnetic field to the first sensor;
obtaining a second measurement at the first sensor while the first sensor is disposed within the non-homogeneous ambient magnetic field and with the second applied magnetic field applied;
calibrating the directional tool based on the first measurement and the second measurement;
placing the directional tool in a borehole; and
obtaining a downhole survey measurement with the calibrated directional tool in the wellbore.

2. The method of claim 1, wherein at least one of the first applied magnetic field and the second applied magnetic field is zero.

3. The method of claim 1, wherein the borehole string is a drill string and further comprising drilling the wellbore with the drill string using the downhole survey measurements.

4. The method of claim 1, further comprising:
disposing a second sensor in the non-homogeneous ambient magnetic field;
applying the first applied magnetic field to the second sensor;
obtaining a third measurement at the second sensor, while the second sensor is disposed within the non-homogeneous ambient magnetic field and with the first applied magnetic field applied;
applying the second applied magnetic field to the second sensor;
obtaining a fourth measurement at the second sensor while the second sensor is disposed within the non-homogeneous ambient magnetic field and with the second applied magnetic field applied; and
calibrating the directional tool based on the first, second, third, and fourth measurement.

5. The method of claim 4, wherein the second sensor is a calibrated sensor.

6. The method of claim 1, wherein calibrating includes determining one or more calibration parameters, the one or more calibration parameters being a function of at least one of a sensitivity of the first sensor and a misalignment of the first sensor with respect to the directional tool.

7. The method of claim 4, wherein the directional tool has a first longitudinal axis, further comprising determining a sensor reference angle between the first longitudinal axis and an axis of the second sensor and calibrating the directional tool based on the determined sensor reference angle.

8. The method of claim 4, wherein the directional tool has a first longitudinal axis and the second sensor is in a calibrated reference directional tool having a second longitudinal axis, further comprising determining a tool reference angle between the first longitudinal axis and the second longitudinal axis and calibrating the directional tool based on the determined tool reference angle.

9. The method of claim 8, wherein the tool reference angle is smaller than 10 degrees.

10. The method of claim 8, wherein the directional tool and the calibrated reference directional tool are of the same design with respect to at least one of dimensions, magnetic sources, and magnetic material distribution.

11. The method of claim 1, wherein the directional tool has a first longitudinal axis and the first applied magnetic field and the second applied magnetic field are substantially aligned to the first longitudinal axis.

12. The method of claim 1, wherein the first sensor has a response to the first applied magnetic field or the second applied magnetic field that is defined by a first-degree polynomial.

13. The method of claim 1, further comprising applying the first applied magnetic field and the second applied magnetic field along at least one of the x-axis of the directional tool, the y-axis of the directional tool and the z-axis of the directional tool.

14. A method of surveying a wellbore with a directional tool in a borehole string, comprising:
disposing a first sensor of the directional tool in a non-homogeneous ambient magnetic field prior to use of the directional tool in the borehole string;
applying a first applied magnetic field to the first sensor;
obtaining a first measurement at the first sensor while the first sensor is disposed within the non-homogeneous ambient magnetic field and with the first applied magnetic field applied;
applying a second applied magnetic field to the first sensor;
obtaining a second measurement at the first sensor while the first sensor is disposed within the non-homogeneous ambient magnetic field and with the second applied magnetic field applied;
calibrating the directional tool based on the first measurement and the second measurement; and
placing the directional tool in a borehole; and
obtaining a downhole survey measurement with the calibrated directional tool in the wellbore,
wherein the directional tool has a first longitudinal axis, further comprising: determining a bias of the first sensor from a measurement of the first sensor obtained with the first longitudinal axis aligned parallel to the earth's magnetic field and a measurement of the first sensor obtained with the first longitudinal axis aligned anti-parallel to the earth's magnetic field.

15. The method of claim 1, further comprising determining a misalignment of the first sensor with respect to the directional tool from the calibration.

16. The method of claim 1, further comprising using the calibrated directional tool to determine a magnetic gradient in the wellbore.

17. The method of claim 1, wherein calibrating includes determining one or more calibration parameters, the one or more calibration parameters being a function of temperature and wherein the one or more calibration parameters are determined for a first temperature and a second temperature.

18. The method of claim 1, wherein the directional tool includes a wire configured to carry a current and wherein calibrating includes determining one or more calibration parameters, wherein the one or more calibration parameters being a function of the current and wherein the one or more calibration parameters are determined for a first current through the wire and for a second current through the wire.

19. A directional tool for use in a borehole string for surveying a wellbore, comprising:
a first sensor calibrated prior to use of the directional tool in the wellbore, the first sensor calibrated by:
disposing the first sensor in a non-homogeneous ambient magnetic field, wherein the non-homogeneous ambient magnetic field comprises an ambient earth's magnetic field that is disturbed by a magnetic material or a magnetic source;

applying a first applied magnetic field to the first sensor;

obtaining a first measurement at the first sensor, while the first sensor is disposed within the non-homogeneous ambient magnetic field and with the first applied magnetic field applied;

applying a second applied magnetic field to the first sensor;

obtaining a second measurement at the first sensor while the first sensor is disposed within the non-homogeneous ambient magnetic field and with the second applied magnetic field applied; and calibrating the directional tool based on the first measurement and the second measurement;

wherein the directional tool obtains a downhole survey measurement once disposed in the wellbore.

20. The directional tool of claim 19, wherein at least one of the first applied magnetic field and the second applied magnetic field is zero.

21. The directional tool of claim 19, wherein the borehole string is a drill string and further comprising drilling the wellbore with the drill string by using the downhole survey measurements.

22. The directional tool of claim 19, further comprising:

disposing a second sensor in the non-homogeneous ambient magnetic field;

applying the first applied magnetic field to the second sensor;

obtaining a third measurement at the second sensor, while the second sensor is disposed within the non-homogeneous ambient magnetic field and with the first applied magnetic field applied;

applying the second applied magnetic field to the second sensor;

obtaining a fourth measurement at the second sensor while the second sensor is disposed within the non-homogeneous ambient magnetic field and with the second applied magnetic field applied; and calibrating the directional tool based on the first, second, third, and fourth measurement.

23. The directional tool of claim 22, wherein the second sensor is a calibrated sensor.

24. The directional tool of claim 19, wherein calibrating includes determining one or more calibration parameters, the one or more calibration parameters being a function at least one of a sensitivity of the first sensor and a misalignment of the first sensor with respect to the directional tool.

25. The directional tool of claim 22, wherein the directional tool has a first longitudinal axis, further comprising determining a sensor reference angle between the first longitudinal axis and an axis of the second sensor and calibrating the directional tool based on the determined sensor reference angle.

26. The directional tool of claim 22, wherein the directional tool has a first longitudinal axis and the second sensor is in a calibrated reference directional tool having a second longitudinal axis, further comprising determining a tool reference angle between the first longitudinal axis and the second longitudinal axis and calibrating the directional tool based on the determined tool reference angle.

27. The directional tool of claim 26, wherein the tool reference angle is smaller than 10 degrees.

28. The method of claim 1, wherein at least one of the first and second applied magnetic field is applied by a coil.

* * * * *